United States Patent [19]

Barritt

[11] Patent Number: 4,703,306
[45] Date of Patent: Oct. 27, 1987

[54] APPLIANCE SYSTEM

[75] Inventor: William D. Barritt, Greenfield, Ind.

[73] Assignee: The Maytag Company, Newton, Iowa

[21] Appl. No.: 912,779

[22] Filed: Sep. 26, 1986

[51] Int. Cl.$^4$ .......................................... H04M 11/04
[52] U.S. Cl. .......................... 340/310 CP; 340/310 A; 340/310 R; 340/538; 340/825.06; 340/825.22
[58] Field of Search ........ 340/310 CP, 310 R, 310 A, 340/825.06, 825.54, 538, 506, 505, 825.22; 455/282, 352; 307/3, 140, 141; 364/131, 132, 138, 140, 141

[56]  References Cited

U.S. PATENT DOCUMENTS

| | | | |
|---|---|---|---|
| 3,334,340 | 8/1967 | McConnell | 340/538 |
| 3,983,553 | 9/1976 | Kesling | 340/365 R |
| 4,163,218 | 7/1979 | Wu | 340/310 R |
| 4,173,754 | 11/1979 | Feiker | 340/310 R |
| 4,200,862 | 4/1980 | Campbell et al. | 340/310 A |
| 4,418,333 | 11/1983 | Schwarzbach et al. | 340/310 A |
| 4,510,778 | 4/1985 | Cotton | 68/12 R |

Primary Examiner—Donnie L. Crosland
Attorney, Agent, or Firm—Richard L. Ward

[57]  ABSTRACT

An appliance system is provided having a plurality of appliances. A master controller includes the user-operable appliance controls as well as associated logic controls for controlling the operating components of the appliances. An interface control is physically associated with each controlled appliance and receives control signals for the various operating components from the master controller by way of power line transmission. The master controller effects a repeating sequence of transmitting and receiving control signals in the form of first and second data packages while the interface control effects a repeating sequence of receiving first data packages and transmitting second data packages. The interface control and the master controller will each interrupt operation of the appliances responsive to the absence of either first or second data packages.

12 Claims, 5 Drawing Figures

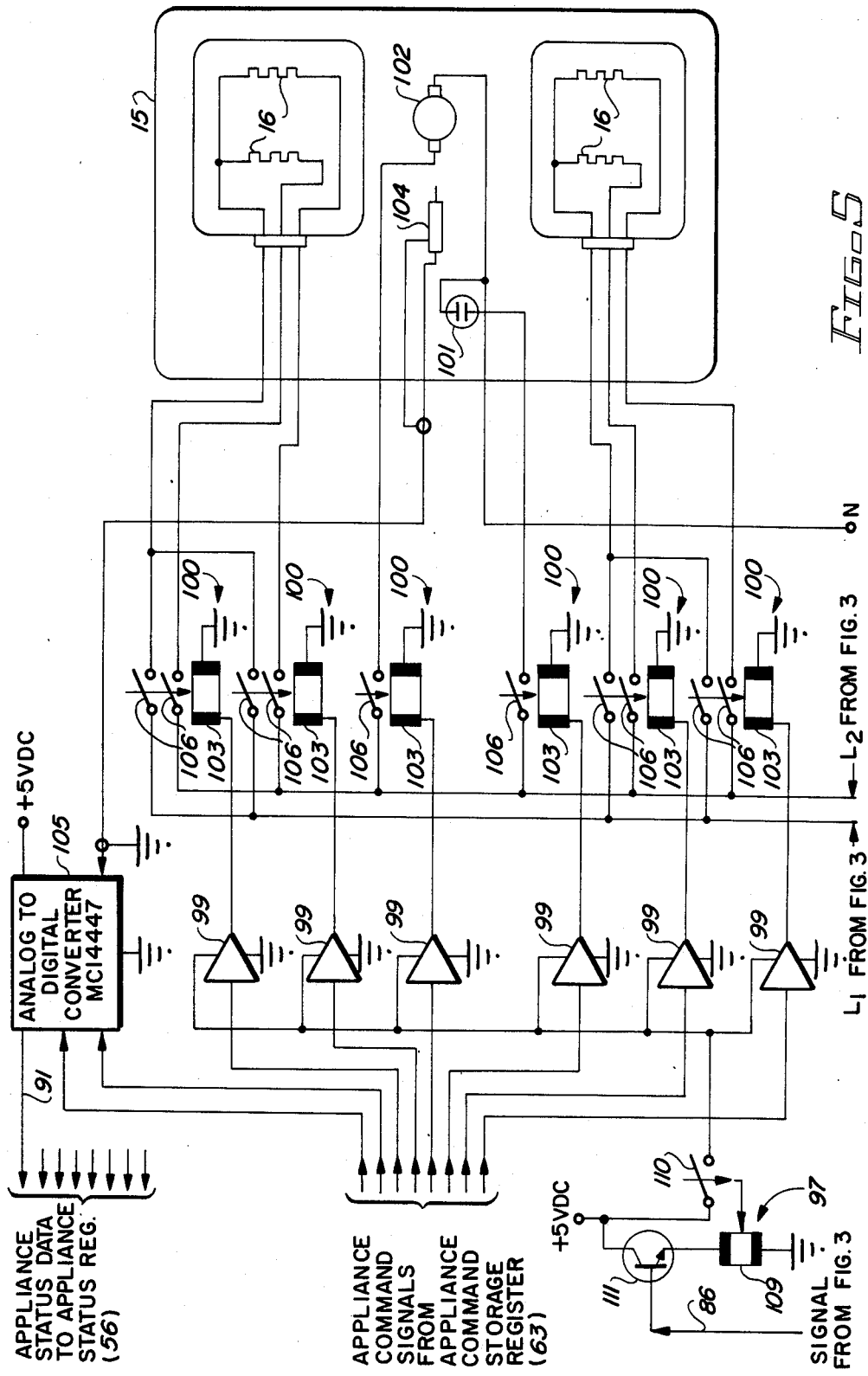

APPLIANCE SYSTEM

BACKGROUND OF THE INVENTION

This invention relates generally to the field of appliance systems and in particular to a system having a plurality of appliances each connected to an alternating current power supply for energization and control of the appliances. Appliance control is effected by way of power line transmission of control information between a master control unit and the controlled appliance via the household wiring.

It is generally well known to use superimposed signals on AC power lines for communication between two or more locations along the power lines. Wu in U.S. Pat. No. 4,163,218 issued on July 31, 1979 and Feiker in U.S. Pat. No. 4,173,754 issued on Nov. 6, 1979 both teach the use of power line communication to control the on-off operation of outlets, lights and appliances through a slave unit associated with the outlets. In each of these patents, the appliance has its own set of controls which may be utilized to operate it independently of the master control unit.

Schwarzbach et al in U.S. Pat. No. 4,418,333 issued on Nov. 29, 1983 teach an appliance control system having a master control unit and a plurality of slave units each including a user programmable microprocessor. Again, the slave units are not part of the appliance that they are used with. Each appliance has its own individual controls and the central control unit merely provides a way to override the controls of the lamp, coffee maker or whatever.

McConnell in U.S. Pat. No. 3,334,340 teaches a remote signal device which receives a signal over the household wiring representative of an appliance condition such as the end of a cycle. The signal receiver is portable and can be moved from room to room but has no capacity for sending a control signal.

Kesling in U.S. Pat. No. 3,983,553 discloses the location of an appliance touch panel away from the appliance itself. Switching information is transmitted over the household wiring to the appliance control box located within the appliance. While the touch panel does include switch members, there is no disclosure indicating that the remotely controlled touch panel contains any of the appliance logic or sequence controls. Further, there is no teaching of the communication of operational information between a master control unit and the appliance control box or of the communication of appliance status operational information to the master control unit.

In the appliance system of the instant invention, a master controller includes the user-operable controls and associated logic controls for controlling operating components of an appliance or appliances. These controls have been physically separated from housings containing the operating components such as heaters, motors and dispensers which actually perform the work function of the particular appliance. In this appliance system, an interface control unit is physically associated with each controlled appliance and receives control signals for the various operating components from the master controller. The interface control units and the master controller continually interact by each transmitting and receiving information relative to the operation of the particular appliance. Thus, the appliances including the interface control units and the master controller are interdependent so that the master controller is not universal as are prior art controls but is dedicated to controlling the operation of particular appliances. In this appliance system, the master controller has no function without the appliances and their associated interface control units and the appliances and interface control units cannot operate without the master controller. There has thus been created a unique appliance system separating appliance user operable controls and logic controls for operating components from the appliances and placing them in a master controller so that all appliances in a particular household area can be operated from one master controller.

SUMMARY OF THE INVENTION

It is therefore an object of the instant invention to provide an improved appliance system.

It is another object of the instant invention to directly and continually communicate the operational status of appliances in the system to the master controller.

It is a further object of the instant invention to provide an appliance system whereby operation of the appliance or appliances can be initiated or modified only at the master controller.

It is a still further object of the instant invention to provide an appliance system whereby the master controller and the interface control units are interdependent and each includes means for interrupting operation of the appliance responsive to the absence of either first or second data packages.

Briefly, the instant invention achieves these objects in an appliance system including a plurality of appliances and operable in associated proximity to each other in accordance with a control strategy with each appliance being connected to an alternating current power supply. The appliance system includes at least a pair of appliances with each having controllable operating components for providing appliance operations and being substantially free of user-operable controls. Power lines are connected to the alternating current power supply for energizing the appliances. A master control is connected to the power lines and includes logic control for stored operational information dedicated to controlling the operation of the appliances according to the control strategy and further includes user-operable controls for entering selective operational information. The master control is operable for processing the stored and selective operational information into first data packages and for transmitting the first data packages. An interface control is operably associated with the appliances and includes apparatus for receiving the first data packages and selectively energizing and deenergizing the controllable operating components to achieve the appliance operations. The interface control also includes apparatus for transmitting a second data package back to the master control to verify reception of the first data package and to provide appliance status operational information. Additional apparatus is provided for effecting communication of the first and second data packages between the master control and the interface control, the master control is operable for receiving the second data packages and reprocessing the stored, selective and appliance status operational information into first data packages. The master control is further operable for effecting a repeating sequence of transmitting the first data packages and receiving the second data packages. The interface control is operable for effecting a repeating sequence of receiving the first data packages and for transmitting the second data packages. The interface control and the master control are each operable for interrupting operation of the appliances responsive to the absence of transmission and receipt of either the first or second data packages.

Operation of the appliance system and further objects and advantages will become evident as the description proceeds and from an examination of the accompanying five sheets of drawings.

BRIEF DESCRIPTION OF THE DRAWINGS

The drawings illustrate a preferred embodiment of the invention with similar numerals referring to similar parts throughout the several views, wherein:

FIG. 5 is a schematic circuit showing the interface between an interface control unit and an appliance.

DESCRIPTION OF A PREFERRED EMBODIMENT

Figure 1:
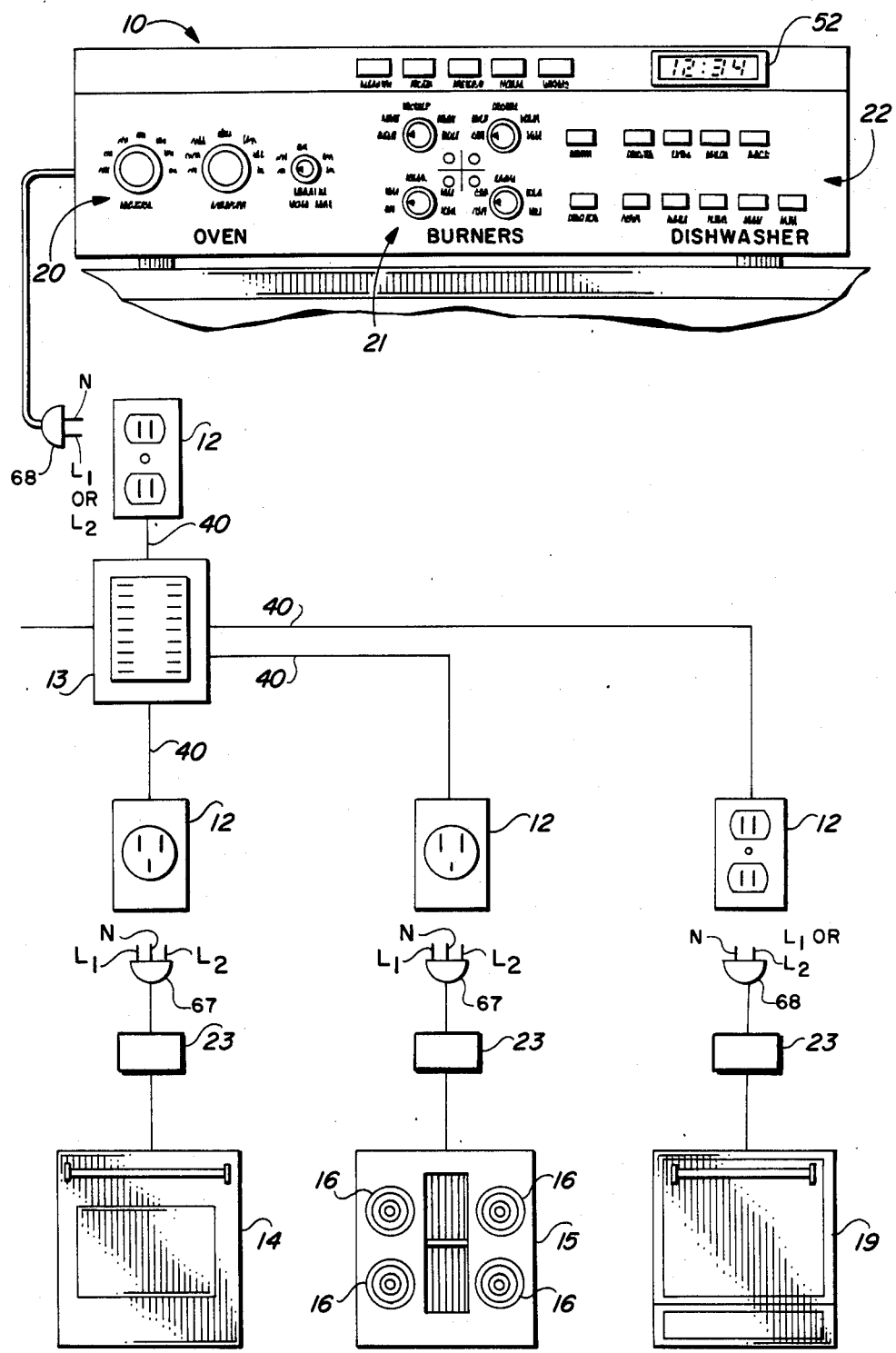
FIG. 1 is a view showing a master controller dedicated to operating a plurality of associated kitchen appliances and showing an interface control unit associated with each appliance.
Figure 2:
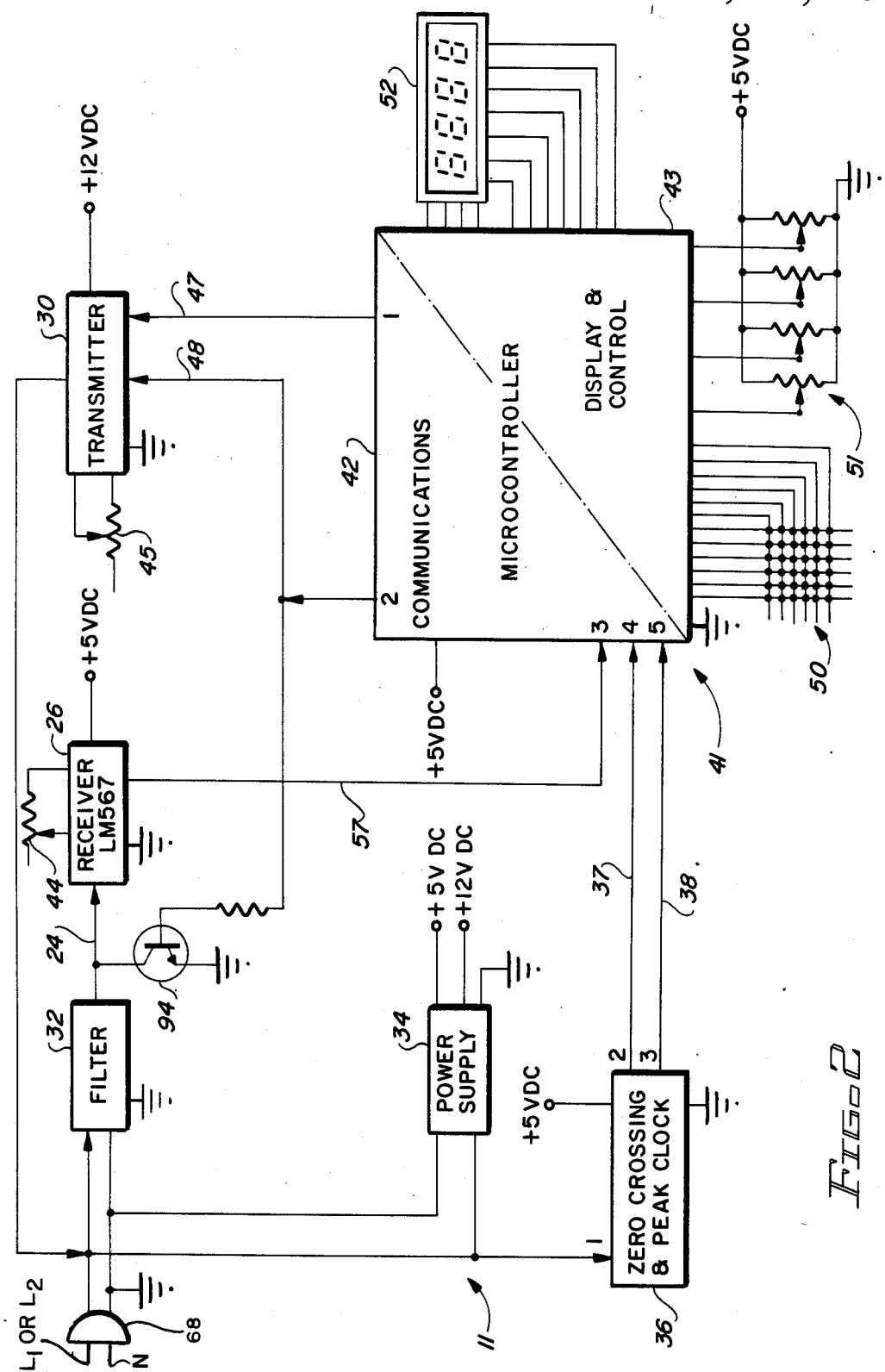
FIG. 2 is a schematic circuit of the master controller.

Turning now to the drawings, there is shown in FIG. 1 an appliance system including a control center or control console 10 housing a central control unit or master controller 11 as shown schematically in FIG. 2 and operable for controlling the cyclic, on-off, variable power or timed functions of a plurality of appliances in associated proximity to each other. As best shown in FIG. 1, the control console 10 including the master controller 11 is a portable unit which may be set on a counter, mounted under a cabinet, set on a table, hand-held held or located anywhere near a household electrical outlet 12 connected to a household electrical service entrance 13. The master controller 11 associated with the control console 10 shown in FIG. 1 is configured in this embodiment to control the complete operation, in accordance with a control strategy, of three common kitchen appliances such as an oven 14, a cooktop 15 with surface burners 16 and a dishwasher 19. It is noted that the oven 14, cooktop 15 and dishwasher 19 in FIG. 1 are shown without control panels and that all user-operable appliance controls 20-22 are located in the control console 10. Associated with the user-operable controls 20-22 and included in the master controller 11 are the logic controls necessary for operating the motors, heaters, dispensers, etc., for the oven 14, cooktop 15 and dishwasher 19. It is anticipated that the master controller 11 may be provided with optional circuitry and control panels so that additional and/or other types of appliances could also be operated from this one master controller 11 such as an automatic washer, clothes dryer or microwave oven for example. The circuitry of the master controller 11 could be variable, such as by adding or deleting circuit boards and various user-operable appliance controls and by changing control panels for example, so that an appliance purchaser could add or subtract features when purchasing an appliance. In this manner, a purchaser can customize the appliance system and control therefor to his or her needs and purchase only a basic appliance having the standard motors, heaters, dispensers and other operating components for each particular appliance. It is further anticipated that the master controller 11 could be operated through a hand-held remote control device (not shown) utilizing infrared or radio signals, for example, to override the user-operable appliance controls 20-22.

Each of the appliances 14, 15 and 19 are shown hard wired to an interface control unit 23 which is plugged into a household electrical outlet 12 for two-way communication with the master controller 11. FIG. 1 shows the master controller 11 and the interface control units 23 with outlet plugs 67 and 68 for connecting to the household wiring 40 by way of the electrical outlets 12. It is anticipated that the household wiring 40 could feed directly to the master controller 11 and the interface control units 23. The interface control units 23 differ in their preset interface control signature word or address 80 which will be discussed further herein. The circuitry associated with each of the interface control units 23 will, for example, be contained in a separate housing as generally shown in FIG. 1. The separate housing for the interface control unit 23 can then be located in a favorable posture on or within the appliance remote from extremes in temperature and humidity. The physical electrical interconnection between one of the interface control units 23 with each appliance 14, 15 or 19 would be accomplished by way of an electrical connector plug (not shown).

Figure 3:
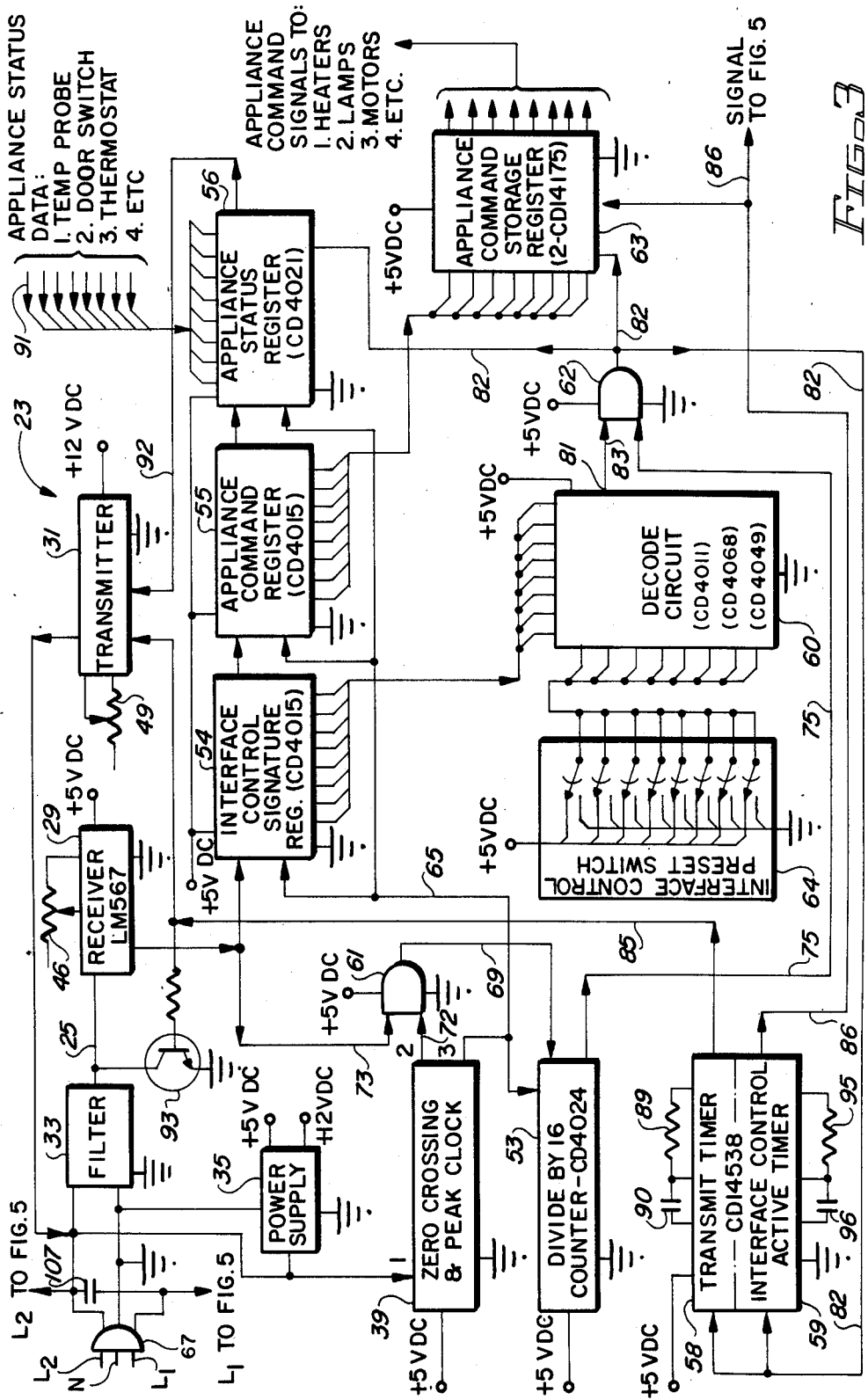
FIG. 3 is a schematic circuit of an interface control unit.

Referring now to FIGS. 2 and 3 which are schematic circuit diagrams representing, in block form, the master controller 11 and one of the plurality of interface control units 23 of the appliance system respectively, it will be apparent that the master controller 11 and each of the interface control units 23 include some of the same components. For instance, each unit, whether master controller 11 or interface control unit 23, includes a receiver 26 or 29, a transmitter 30 or 31, a line coupling filter 32 or 33, a power supply 34 or 35 and a zero crossing and peak clock 36 or 39.

The receiver 26 included in the master controller 11 of FIG. 2 is operable for receiving signals from the transmitter 31 of each interface control unit 23 and conversely the receiver 29 associated with each interface control unit 23 is operable for receiving signals from the transmitter 30 of the master controller 11 by a path including the 60 hertz household electrical wiring 40. In either the master controller 11 or interface control unit 23, the line coupling filter 32 or 33 removes the 60 hertz portion of the line signal before the signal enters the receiver 26 or 29 so that only the signal waveform is present on conductors 24 and 25 of the master controller 11 or interface control unit 23. Although this embodiment utilizes data signals imposed on the alternating current waveform present in the household wiring 40 it is anticipated that similar data signals could be transmitted and received by other methods such as radio frequency signals and that the invention is not to be so limited as to only include data signals over household wiring 40.

The master controller 11 and each of the interface control units 23 have power supply sections 34 and 35 powered by 120 VAC across L1 or L2 and neutral of the household wiring 40. The power supplies 34 or 35 provide 12 VDC and 5 VDC for powering the various components associated with either the master controller 11 or interface control units 23. In the circuit for the master controller 11 of FIG. 2 and the interface control units 23 of FIG. 3, it is noted that all components except the transmitters 30 and 31 are powered by 5 VDC from the power supplies 34 and 35. The transmitters 30 and 31 are powered by 12 VDC from the power supplies 34 and 35.

Referring again to FIG. 2, the zero crossing and peak clock 36 in the master controller 11 continuously provides two output pulses derived from zero crossings of the 60 hertz household wiring 40 input at pin 1. These pulses are designated "transmit" and "reset" pulses and are output on pins 2 and 3 and originate from the zero crossing and peak clock 36 which includes zero crossing detector circuitry. The transmit pulses at pin 2 are developed directly from zero crossings of the 60 hertz waveform. The pulse width of the transmit pulse is regulated to provide sufficient transmit and receive time for each transmitted and received bit of information. The reset pulse at pin 3 is a pulse derived from the plus and minus peak of the 60 hertz waveform. The reset pulse is used to help synchronize all interface control units 23 to receive data sent by the master controller 11 in relationship to zero crossings. If, for example, three interface control units 23 are to be sent data by the master controller 11, the master controller 11 will transmit a first data package 76 to a first addressed interface control unit 23 and will then receive a second data package 77 from the first addressed interface control unit 23. While the second data package 77 is being received, the master controller 11 will, after receipt of each bit of information, transmit a reset pulse for continually resetting the divide-by-16 counters 53 of the non-addressed interface control units 23. By continually resetting the divide-by-16 counters 53 to zero, the non-addressed interface control units 23 will not be allowed to receive data from the other interface control units 23. No interface control unit 23 can receive any data while reset pulses are being sent by the master controller 11. Reset pulses are not transmitted when the master controller 11 is transmitting first data packages 76 and all interface control units 23 are then ready to receive data from the master controller 11. However, when the master controller 11 is receiving second data packages 77 from an addressed interface control unit 23, it will transmit the reset pulses for continually resetting the non-addressed interface control units 23.

The microcontroller 41 shown in FIG. 2 is divided into two sections, a communications section 42 and a display and control section 43. The communications section 42 must continuously communicate with the assigned interface control units 23. The communication section 42 of the microcontroller 41 is synchronized by the signals sent by the zero crossing and peak clock 36 and received at pins 4 (transmit pulse) and 5 (reset pulse) on conductors 37 and 38. Data is sent to the transmitter 30 of the master controller 11 synchronized by the transmit pulses via pins 1 and 2 of the microcontroller 41 on conductors 47 and 48. Data to be processed is received by the microcontroller 41 associated with the master controller 11 of FIGS. 1 and 2 and is synchronized by the receive pulses via pin 3 of the microcontroller 41 on conductor 57. All program logic required to properly decode or format the receive or transmit data is handled by the communications section 42 of the microcontroller 41. The transmit-receive frequency impressed on the household wiring 40 is 125 kilohertz. This running frequency is generated by oscillators located in both the receiver 26 and transmitter 30. The running frequency of these oscillators can be adjusted between 50 and 150 kilohertz by the variable resistors 44 and 45.

In FIG. 2, the various control switches for the appliances shown in FIG. 1 are generally indicated by a matrix of switches 50 and by a plurality of infinite switches 51 associated with controls 20-22. Also shown in FIGS. 1 and 2 is a digital display 52 for reading out time of day and various appliance functions. The display and control section 43 of the microcontroller 41 preferably may be a software program storing operational information for controlling the motors, heaters, dispensers, etc., associated with appliances 14, 15 and 19. The display and control section 43 may also be a set of switches or a mechanical timer such as a common dishwasher or stove timer (not shown) but still including stored operational information. The communications section 42 of the microcontroller 41 looks at the display and control section 43 in much the same way it looks at an interface control unit 23. The communications section 42 takes information given to it by the display and control section 43 and sends it to the corresponding interface control unit 23 that requires the command to effect the desired control of the operating components to carry out the controlled operation.

As previously discussed, each interface control unit 23 must be continually updated or refreshed with appliance operational information or data from the master controller 11. All data must be updated at a predetermined rate, set by the master program, in order to be valid. If the appliance operational information or data from the master controller 11 ceases or is not continually presented at the interface control unit 23, the interface control unit 23 will reset to a power down condition. Similarly, if the interface control unit 23, when addressed, does not continually send second data packages 77 to the master controller 11 a problem is presumed and the master controller 11 will, after a period of time, discontinue transmission to the interface control unit 23 which will, again, cause that interface control unit 23 to reset to a power down condition interrupting power to the appliances 14, 15 or 19. Thus, in this appliance system, operation of an appliance 14, 15 or 19 cannot be maintained without both the master controller 11 and an interface control unit 23 being concurrently on-line and continually communicating with each other.

In operation, the microcontroller 41 associated with the master controller 11 of FIG. 2 continually processes appliance control information including stored operational information and selective operational information as entered by way of the user operated controls 20-23 into first data packages 76 and effects the transmission of processed data via the household electrical wiring 40 at a relatively low transmission rate of about 120 baud or 120 bits of information per second. This low speed transmission rate helps to prevent transmission noise and provides a slight delay between the time an appliance 14, 15 or 19 is actuated through the user operable controls 20-22 and the time that the appliance 14, 15 or 19 responds.

Figure 4:
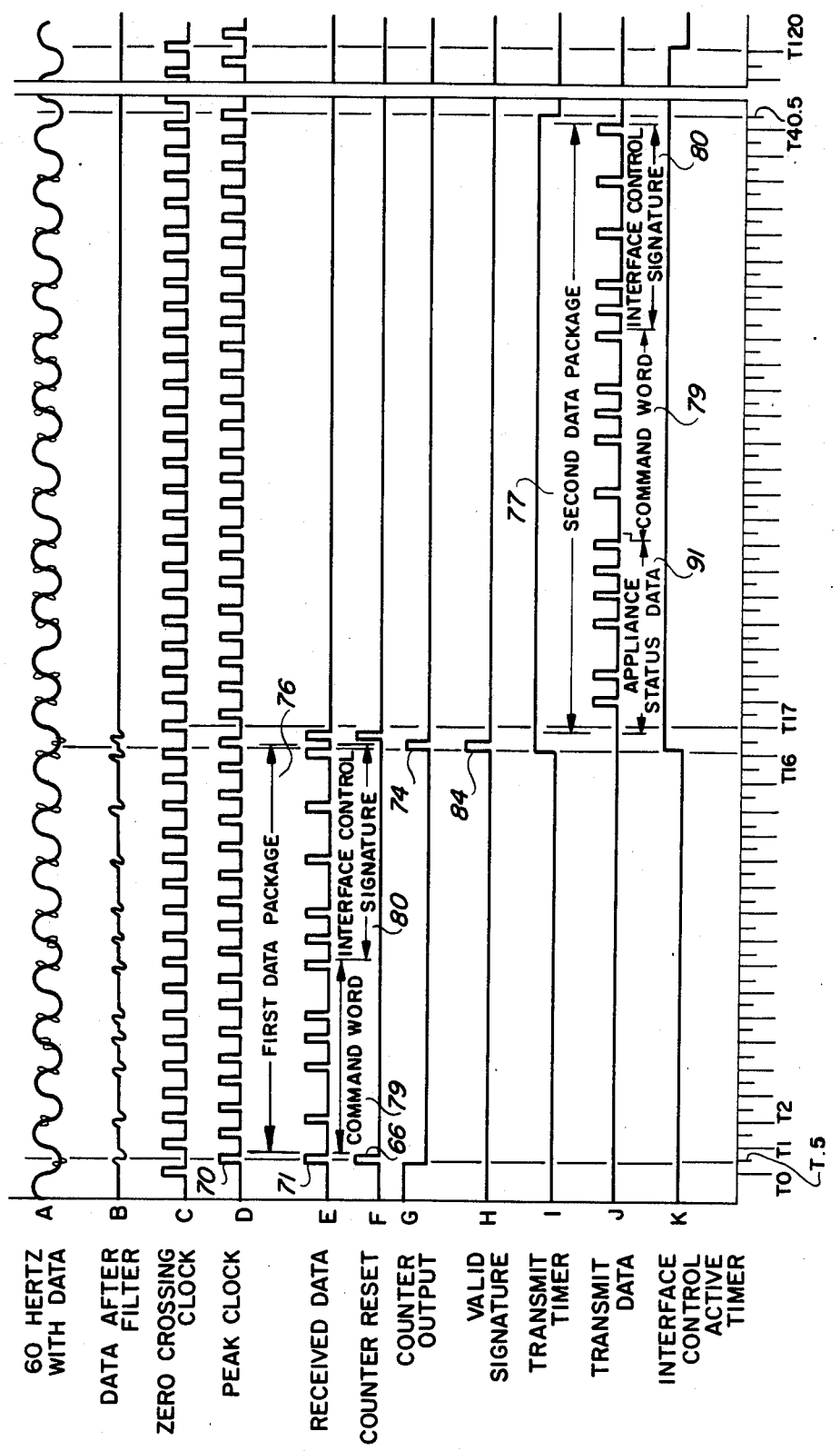
FIG. 4 is a timing chart associated with an interface control unit of FIG. 3.

Turning now to FIGS. 3 and 4, there are shown the schematic circuit diagram and the timing chart respectively for an interface control unit 23. In FIG. 4 the letters A-K have been utilized to designate waveforms output by various components and to designate data locations. While the interface control unit 23 of FIG. 3 shows a 240 VAC outlet plug 67, the interface control unit 23 is powered by 120 VAC across L2 and neutral. The 240 VAC across L1 and L2 is shown directed to the cooktop 15 of FIG. 5 which is powered by 240

VAC. The interface control unit 23 for the 120 VAC dishwasher 10 would include a 120 VAC outlet plug 68 as shown in FIG. 1 including L1 or L2 and neutral. In addition to having some of the same components as the master controller 11, the interface control units 23 each further include a divide-by-16 counter 53 such as an RCA CD4024 binary ripple counter, a transmit timer 58 and an interface control active timer 59 comprising together an RCA CD14538 dual monostable multivibrator, interface control signature and appliance command registers 54 and 55 utilizing RCA CD4015 registers, an appliance status register 56 such as an RCA CD4021 shift register, a decode circuit 60 which includes RCA CD4011 and CD4068 NAND/AND gates and an RCA CD4049 hex buffer converter, a pair of AND gates 61 and 62, an appliance command storage register 63 utilizing a pair of RCA CD14175 quad flip flops and an interface control preset switch 64. The running frequency of 125 kilohertz for the interface control unit 23 is generated by oscillators located in the receiver 29 and transmitter 31. The frequency of these oscillators can be adjusted between 50 and 150 kilohertz by the variable resistors 46 and 49.

It is anticipated that an interface control unit 23 could be produced to control the most sophisticated anticipated appliance 14, 15 or 19. This interface control unit 23 could then be used to control any of the less sophisticated appliances 14, 15 or 19 by connecting only the required inputoutput lines from the appliance status register 56 and the appliance command storage register 63. For example, the interface control unit 23 would have a connector portion (not shown) with all input-output lines and each individual appliance 14, 15 or 19 would have only the input-output lines that it requires in a mating connector portion (not shown). Unused input-output lines to and from the interface control unit 23 would not be connected. Thus, an interface control unit 23 for a particular appliance 14, 15 or 19 could only sense operating conditions for that appliance 14, 15 or 19 and could, therefore, be dedicated to one appliance 14, 15 or 19.

FIG. 4 is representative of a timing chart for an interface control unit 23 as depicted in FIG. 3. As shown in FIG. 4, the zero crossing clock waveform "C" produced by the zero crossing circuitry associated with the zero crossing and peak clock 39 of the interface control unit 23 detects each time the 60 hertz waveform "A" swings from negative to positive or from positive to negative voltage and inputs this to the divide-by-16 counter 53, the interface control signature register 54, the appliance command register 55 and the appliance status register 56 by way of conductor 65 in FIG. 3.

As further indicated in FIG. 4, the interface control unit 23 will generate a counter reset pulse 66 on waveform "F" at T.5 at the output of gate 61 on conductor 69 shown in FIG. 3. This occurs when a peak clock pulse 70 on waveform "D" and received data pulse 71 on waveform "E" are coincidentally received at the inputs of gate 61. The peak clock pulse 70 and the received data pulse 71 are carried by conductors 72 and 73 to gate 61 in FIG. 3. At the same point in time, the counter reset pulse 66 on waveform "F" will reset the output of the divide-by-16 counter 53 shown in FIG. 3 low as indicated by waveform "G". The divide-by-16 counter 53 will count 16 zero crossings and will then output a pulse 74 on waveform "G" at T16 which is carried by conductor 75 in FIG. 3.

The received data waveform "E" of FIG. 4 shows that data, either a one indicated by a pulse 71 or a zero indicated by no pulse, is shifted into the registers 54 and 55 of FIG. 3 at every zero crossing after the counter reset pulse 66 on waveform "F" at T.5. In the example shown in FIG. 4, the first data package 76 loaded into the appliance command register 55 will include a command word 79 comprising data bits 01011101 and an interface control signature word 80 comprising data bits 11010101 into the interface control signature register 54 by T16. Referring again to FIG. 4, at T1, the rising edge of the zero crossing waveform "C" and the absence of data at waveform "E" results in loading a zero into position one of the interface control signature register 54. On the falling edge of the zero crossing waveform "C" at T2, the interface control signature register 54, the appliance command register 55 and the appliance status register 56 are shifted one position to the right allowing the reception of the next data bit in position 2 of the registers 54 and 55. At T2 there exists a data pulse 71 on waveform "E". That pulse 71 is loaded into the second position of the interface control signature register 54 as a one. This process continues for 16 zero crossings until 16 ones and zeros of any combination have been loaded into the registers 54 and 55.

At T16, in FIG. 4, the output pin 81 of the decode circuit 60 in FIG. 3 will go high if the received data on waveform "E" shifted into the interface control signature register 54 and present at the input to the decode circuit 60 equals the preset code of the input to the interface control preset switch 64. A valid signature pulse 84 on waveform "H" is output by gate 62 on conductor 82 only if waveform "G" on conductor 75 and the output of the decode circuit 60 on conductor 83 occur at the inputs of gate 62.

With a valid signature pulse 84 on waveform "H", the interface control unit 23 will store the received data in the appliance command storage register 63 shown in FIG. 3 and preload the appliance status register 56 with appliance status data or appliance status operational information 91 presented at its input. The appliance command storage register 63 will store information received from the master controller 11 relating to operation of appliance components such as heaters, lamps, motors, dispensers, etc., depending upon the appliance being operated by the master controller 11. At the same time, the appliance status register 56 will receive appliance status data or operational information 91 from the appliance relating to the operational status of elements or components such as a temperature probe, door switch, thermostat, etc., and again dependent upon the appliance being operated. At T16, the transmit timer 58 and interface control active timer 59 are triggered high by the valid signature pulse 84 on waveform "H".

The output conductors 85 and 86 from the transmit and interface control active timers 58 and 59 respectively carry the waveforms "I" and "K". As shown in FIG. 4, the transmit timer 58 will be energized from T16 to T40.5. This time period is preset by the values assigned to resistor 89 and capacitor 90 for transmitting a second data package 77 comprising the command word 79 and interface control signature word 80 associated with the first data package 76 originally transmitted to the interface control unit 23 back to the master controller 11 along with eight additional bits of information representing appliance status operational information 91 shown by the transmit data waveform "J" in FIG. 4. Information present in the three registers 54–56 and represented by the transmit data waveform "J" will be serially shifted from the interface control signature register 54, the appliance command register 55 and the appliance status register 56 to the transmitter 31 on conductor 92 as shown in FIG. 3. The transmit data waveform "J" on conductor 92 is clocked into the transmitter 31 by the zero crossing clock waveform "C". The transmitter 31 transmits this data back onto the 60 hertz household electrical wiring 40 to be received by the master controller 11. Whenever the transmit timer 58 is active as indicated by waveform "I" to transmit data back to the master controller 11, a transistor 93, shown in FIG. 3, is turned on shorting the input of the receiver 29 to ground to prevent the transmitted signal from returning to the receiver 29 of the same interface control unit 23. In FIG. 2, there is shown a transistor 94 at the input to the receiver 26 of the master controller 11 for the same purpose.

As shown by waveform "K" in FIG. 4, the interface control active timer 59 will remain energized for a period of time longer than the time it takes for the master controller 11 to send first data packages 76 to all interface control units 23 and return to that same interface control unit 23. For example, if each interface control unit 23 requires T40 to receive a first data package 76 and transmit a second data package 77, this will take up to T120 for three interface control units 23. If the master controller 11 should not send data to the interface control unit 23 shown in FIG. 3 at T120 or within the preset period of time determined by the values chosen for resistor 95 and capacitor 96 in FIG. 3, the interface control active timer 59 will go inactive at T120 shown by waveform "K" in FIG. 4. This will cause the appliance command storage register 63 to reset its outputs to zero and disconnect power to the relay drive circuitry 97 as depicted in FIG. 5 causing the appliance 14, 15 or 19 associated with the interface control unit 23 to stop functioning. In this condition, the interface control unit 23 assumes that the master controller 11 is no longer plugged in or has a problem with its transmitter 30. There must be continual updating of the interface control unit 23 by the master controller 11 and the interface control unit 23 must send second data packages 77 to the master controller 11 for the appliance 14, 15 or 19 to function. In other words, the master controller 11 and the interface control units 23 are interdependent.

Referring again to FIG. 3, the microcontroller 41 of FIG. 2 will process stored operational information as included in a software program for example and selective operational information as input through the user-operable controls 20–22 and will continually output, at zero crossings of the 60 hertz waveform, 16 bit first data packages 76 consisting of the command word 79 and interface control signature word 80. These first data packages 76 are output at a frequency of approximately 125 kilohertz which is superimposed on the 60 hertz household electrical wiring 40. As in the master controller 11 of FIG. 2, the running frequency of each interface control unit 23 is generated by oscillators located in both the receiver 29 and transmitter 31 and adjustable by variable resistors 46 and 49. All of the first data packages 76 are received by all of the interface control units 23 on line with the master controller 11 and each interface control unit 23 is required to decode all of the first data packages 76.

Referring now to FIG. 5 in particular, there is shown the interface between an interface control unit 23 for a cooktop 15 having a plurality of electric surface burners 16. On the left side of FIG. 5 there are shown the inputs from the appliance command storage register 63 and the outputs to appliance status register 56 for the interface control unit 23 which correspond similarly to those registers 56 and 63 previously described with respect to FIG. 3.

Appliance operational information is output from the appliance command storage register 63 to a plurality of inverters 99 which serve as drivers for low voltage relays 100 which provide switching for either 120 or 240 VAC to a pilot lamp 101, fan motor 102 and the four electric surface burners 16 associated with the cooktop 15. Signals from the inverters 99 energize the coils 103 of the relays 100 to close the relay contacts 106 energizing the various components. Relay drive circuitry 97 includes a relay coil 109 and relay contacts 110. When the switching transistor 111 is turned on by the interface control active signal on conductor 86 it energizes the relay coil 109 to close the relay contacts 110 and provide 5 VDC to the inverters 99.

As further shown in FIG. 5, the analog output of a temperature probe 104 is directed to a Motorola MC14447 analog-to-digital converter 105 to provide digital appliance status operational information 91 to the input of the appliance status register 56. The appliance status operational information 91 is returned to the master controller 11 as part of the second data package 77 shown in FIG. 4. As previously discussed, the appliance status operational information 91 will vary depending on the type of appliance being controlled. The interface control units 23 will be oriented or dedicated to particular appliances 14, 15 or 19 even though each interface control unit 23 is of the same construction. This dedication is due to the particular operations sensed for the various appliances 14, 15 and 19 and transmitted back to the master controller 11 as appliance status operational information 91. The master controller 11 is operable for reprocessing stored operational information, selective operational information and appliance status operational information into subsequent first data packages 76 for transmission to the addressed interface control unit 23 for continuing operation of the appliance 14, 15 or 19 associated therewith.

Since the appliance system described herein incorporates at least one appliance operated by 240 VAC such as a cooktop 15 or oven 19, the distance traveled by data from the master controller 11 to the interface control unit 23 or vice-versa can be substantially shortened by placing a capacitor 107 across lines L1 and L2 as shown in FIG. 3. This will permit the data to be directly coupled across L1 and L2 through the capacitor 107 rather than traveling through the service entrance 13 and a step down transformer (not shown) located outside the building. The resulting shorter path permits the use of a lower powered transmitter 30 or 31.

For a particular interface control unit 23, and according to the example shown in FIGS. 3 and 4 and controlling the operation of a cooktop 15 as shown in FIG. 5, the first data packages 76 are received from the master controller 11 via the household electrical wiring 40. The circuitry associated with the filter 33 filters out the 60 hertz signal and the 125 kilohertz signal, represented by waveform "B" in FIG. 4, is presented to the receiver 29 of the interface control unit 23. The receiver 29 of the interface control unit 23 includes a National Semiconductor LM567 tone decoder which is tuned to receive the 125 kilohertz signal and converts the 125 kilohertz signal to logic level signals using standard data logic. The 16 bit first data packages 76 each contain 8 bits of address data code or interface control signature word 80 and an 8 bit master data word or command word 79 including stored and selective operational information. As previously discussed, the first data packages 76 are continually sent to each interface control unit 23 with each interface control unit 23 having a different preset address data code or interface control signature word 80.

The divide-by-16 counter 53 will be reset low by a counter reset pulse 66 on waveform "F" at T.5 at the output of gate 61 in FIG. 3. This occurs, as shown in FIG. 4, due to the simultaneous occurrence of a peak clock pulse 70 on waveform "D" and a received data pulse 71 on waveform "E", which together produce counter reset pulse 66 on waveform "F". From that point in time until 16 zero crossings later, the waveform "G" at the divide-by-16 counter 53 is low. With the output "G" at the divide-by-16 counter 53 low, data is shifted into the registers 54 and 55 at every zero crossing. Two operational conditions must be present to shift data into the registers 54 and 55: (1) there must be a zero crossing, and (2) there must be data or no data present (0 or 1). In this embodiment of the invention, a logic 0 is considered data. Thus each interface control unit 23 has been sent a 16 bit first data package 76 containing an interface control signature word 80 and a word command 79 by the master controller 11.

The interface control unit 23 will compare the interface control signature word 80 at the interface control signature register 54 to the interface control signature code preset in the interface control preset switch 64 shown in FIG. 3. The interface control preset switch 64 for the interface control unit 23 associated with the cooktop 15 has been manually preset to an interface control signature code of 11010101 as shown in the example of FIGS. 3 and 4. The information received from the interface control signature register 54 is compared with the preset interface control signature code. If the interface control signature word 80 from the first data package 76 is the same as the preset interface control signature code, a valid signature pulse 84 as shown on waveform "H" in FIG. 4 will occur soon after the last bit of the first data package 76.

As further shown in FIG. 4, when a valid signature pulse 84 on waveform "H" is detected by the interface control unit 23 for the cooktop 15, the master data word or command word 79 of the first data package 76 is shifted into the appliance command storage register 63 for the cooktop 15. This will store information sent by the master controller 11 pertaining to relays 100, etc., needed to control operation of the cooktop 15. At substantially the same point in time, an interface control data word or second data package 77 comprising the first data package 76 and appliance status data or appliance status operational information 91 is loaded into the appliance status register 56 for the cooktop 15. The second data package 77 could thus include information relating to temperature sensing through the temperature probe 104 shown in FIG. 5.

Further, the valid signature pulse 84 on waveform "H" in FIG. 4 starts the transmit and interface control active timers 58 and 59. When the valid signature pulse 84 shown on waveform "H" in FIG. 4 energizes the timers 58 and 59, the transmit timer 58 will be allowed to operate for an amount of time sufficient to transmit 24 bits of information comprising the second data package 77 back to the master controller 11. Thus, the verified first data package 76 for the cooktop 15 of FIG. 5 is effectively echoed back to the master controller 11 establishing the required two-way communication between the master controller 11 and the interface control unit 23. This also allows the master controller 11 to compare transmitted data with received data for transmission verification. The appliance control information sent in the first data packages 76 will be constantly reprocessed according to the type of appliance status operational information 91 returned to the master controller 11 by the interface control unit 23. If, for example, the appliance status operational information 91 supplied by the temperature probe 104 of FIG. 5 indicates that the cooking temperature is too high or too low, the master controller 11 will send reprocessed first data packages 76 to the interface control unit 23 to increase or decrease the cooking temperature as required.

The interface control active timer 59 in FIG. 3 is also started when a valid signature pulse 84 on waveform "H" is first detected by the interface control unit 23. The interface control active timer 59 is retriggered once for each access to the interface control unit 23 and will be on for at least as long as the time required for all interface control units 23 to be updated.

The appliance system described herein includes a plurality of appliances in associated proximity to each other and with each appliance being connected to an alternating current power supply. Each of the appliances includes controllable operating components providing appliance operation and is substantially free of user-operable controls. A master controller is connected to power lines which energize the appliance and includes logic control for stored operational information to control operation of the appliances. The master controller also includes user-operable controls for entering selective operational information. The master controller processes the stored and selective operational information into first data packages and transmits them. An interface control is associated with the appliances and has apparatus for receiving the first data packages and for energizing and deenergizing the controlled operating components to provide appliance operation. The interface control also has apparatus for transmitting a second data package back to the master control to verify reception of the first data package and provide appliance status operational information. The appliance system further includes apparatus for effecting communication of the first and second data packages between the master controller and the interface control with the master controller receiving the second data packages and reprocessing the stored, selective and appliance status operational information into updated first data packages. The master controller effects a repeating sequence of transmitting first data packages and receiving second data packages while the interface control effects a repeating sequence of receiving first data packages and transmitting second data packages. The interface control and the master controller will each interrupt operation of the appliances responsive to the absence of either first or second data packages.

A number of distinct advantages are achieved by the appliance system of the instant invention as compared to systems where each appliance has individual controls incorporated into separate appliance control panels or housings. By utilizing the art of power line communications, the instant invention has provided an appliance system which centralizes the user operable controls as well as the controls for controlling operating components of the appliance. This appliance system eliminates the need to squeeze controls into an area of an appliance which may be already cramped. The appliance system provides for communication of the appliance operational status to the master controller through the interface control rather than simply the status of a slave unit as provided for in the prior art. As previously mentioned, by removing the user operated controls and controls for controlling operating components from the appliance itself and placing them in the master controller, the controls, especially delicate electronic components, are removed from a potentially harmful environment. This will allow the use of components having lower temperature specifications and, in the case of dishwashers and washing machines, water protective coatings may be eliminated.

Removal of the user operable controls from the appliance further allows the appliance to be easily cleaned since there are no knobs to clean around. Also, the master controller can be located away from heat producing surface elements or moving parts and the master controller can be conveniently located for ease of operation by the handicapped. In addition, the master controller can be made convertible, by adding or deleting circuitry boards appliance features can be added or subtracted or the master controller may be expanded to control additional appliances. The control panel for the master controller would be made interchangeable depending on the features and appliances controlled in coordination with the addition or deletion of circuit boards. This appliance system also enhances the possibility of automated manufacturing since appliance wiring will be minimized and the electronics are very adaptable to automation. Further, it is possible with this appliance system to replace only the worn out appliance without purchasing a new master controller.

In the drawings and specification, there has been set forth a preferred embodiment of the invention and although specific terms are employed, these are used in a generic and descriptive sense only and not for purposes of limitation. Changes in the form and proportion of parts as well as the substitution of equivalents are contemplated as circumstances may suggest or render expedient without departing from the spirit or scope of the invention as further defined in the following claims.

I claim:

1. An appliance system including a plurality of appliances in associated proximity to each other and operable in accordance with a control strategy with each appliance being connected to an alternating current power supply for energization and control of the appliances, the combination comprising: at least a pair of appliances to be controlled with each having controllable operating components for providing appliance operations and being substantially free of user-operable controls; power lines connected to said alternating current power supply for energizing said appliances; master control means connected to said power lines and including logic control means for stored operational information dedicated to controlling the operation of said appliances according to said control strategy and further including user-operable controls for entering selective operational information, said master control means being operable for processing said stored and selective operational information into first data packages and for transmitting said first data packages; interface control means operably associated with said appliances including means for receiving said first data packages and selectively energizing and deenergizing said controllable operating components to achieve said appliance operations, said interface control means also including means for transmitting a second data package back to said master control means to verify reception of said first data package and to provide appliance status operational information; and means for effecting communication of said first and second data packages between said master control means and said interface control means, said master control means operable for receiving said second data packages and reprocessing said stored, selective and appliance status operational information into said first data packages, said master control means being operable to effect a repeating sequence of transmitting said first data packages and receiving said second data packages, said interface control means being operable to effect a repeating sequence of receiving said first data packages and transmitting said second data packages, said interface control means and said master control means being operable for interrupting operation of said appliances responsive to the absence of transmission and receipt of either said first or second data packages.

2. An appliance system as defined in claim 1 including a single master control means located away from at least one of said appliances.

3. An appliance system as defined in claim 1 wherein each appliance includes interface control means and each appliance has a unique preset address code corresponding to an address portion of said first data package whereby said appliance will receive and respond to the operational information contained in said first data package when said preset address code and said address portion of said first data package match.

4. An appliance system as defined in claim 1 wherein said master control means is operable for selectively energizing and controlling the operation of a single appliance or for simultaneously energizing and controlling independent operation of all appliances included in said appliance system.

5. An appliance system as defined in claim 1 wherein said first data packages are transmitted to each of said appliances in sequence during a predetermined period of time.

6. An appliance system as defined in claim 1 wherein said second data package includes said first data package and said appliance status operational information.

7. An appliance system as defined in claim 1 wherein said means for effecting communication includes means for transmitting and receiving said first and second data packages via said power lines.

8. An appliance system including a plurality of appliances in associated proximity to each other and operable in accordance with a control strategy with each appliance being connected to an alternating current power supply, the combination comprising: at least a pair of appliances with each having controllable operating components for providing appliance operations and being substantially free of user-operable controls; power lines connected to said alternating current power supply for energizing said appliances; a single master control means located away from said appliances and connected to said power lines, said master control means including logic control means for stored operational information dedicated to controlling the operation of said appliances according to said control strategy and further including user-operable controls for entering selective operational information, said master control means being operable for processing said stored and selective operational information into first data packages including an appliance address code and for transmitting said first data packages to all of said appliances; an interface control means operably associated with each of said appliances and including means for receiving and decoding said first data packages, said interface control means being responsive to a unique appliance address code for energizing and deenergizing said controllable operating components of its associated appliance to achieve said appliance operations, said interface control means at the addressed appliance being operable for transmitting a second data package back to said master control means to verify reception of said first data package and to provide appliance status operational information; and means for effecting communication of said first and second data packages between said master control means and said interface control means, said master control means operable for receiving said second data packages and reprocessing said stored, selective and appliance status operational information into updated first data packages, said master control means being operable to effect a repeating sequence of transmitting said first data packages to all of said appliances and receiving said second data packages from addressed appliances, said interface control means associated with an addressed appliance being operable to effect a repeating sequence of receiving said first data packages and transmitting said second data packages, said interface control means and said master control means being operable for interrupting operation of said appliances responsive to absence of transmission and receipt of either said first or second data packages.

9. An appliance system as defined in claim 8 wherein a first data package is addressed to each appliance during said repeating sequence by said master control means.

10. An appliance system as defined in claim 8 wherein said means for effecting communication includes means for transmitting and receiving said first and second data packages via said power lines.

11. An appliance system as defined in claim 8 wherein said master control means is further operable for intermittantly transmitting reset pulses to all non-addressed appliances when receiving said second data package from said addressed appliance to prevent the reception of said second data package by said non-addressed appliances.

12. An appliance system as defined in claim 8 wherein said interface control means for operation with 240 VAC appliances includes line coupling means across lines L1 and L2 for shortening the data transmission path between said master control means and said interface control means.

* * * * *